US010510755B2

(12) United States Patent
Chang et al.

(10) Patent No.: US 10,510,755 B2
(45) Date of Patent: *Dec. 17, 2019

(54) SEMICONDUCTOR DEVICE AND MANUFACTURE METHOD THEREOF

(71) Applicant: TAIWAN SEMICONDUCTOR MANUFACTURING CO., LTD., Hsin-Chu (TW)

(72) Inventors: Che-Cheng Chang, New Taipei (TW); Chih-Han Lin, Hsinchu (TW); Horng-Huei Tseng, HsinChu (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/041,996

(22) Filed: Jul. 23, 2018

(65) Prior Publication Data

US 2018/0350813 A1    Dec. 6, 2018

Related U.S. Application Data

(63) Continuation of application No. 15/722,229, filed on Oct. 2, 2017, now Pat. No. 10,032,774, which is a (Continued)

(51) Int. Cl.
*H01L 27/092* (2006.01)
*H01L 29/78* (2006.01)
*H01L 27/088* (2006.01)
*H01L 21/8238* (2006.01)
*H01L 29/06* (2006.01)
(Continued)

(52) U.S. Cl.
CPC .. *H01L 27/0924* (2013.01); *H01L 21/823821* (2013.01); *H01L 21/823842* (2013.01); *H01L 21/823864* (2013.01); *H01L 27/0886* (2013.01); *H01L 27/092* (2013.01); *H01L 29/0649* (2013.01); *H01L 29/4958* (2013.01); *H01L 29/4966* (2013.01); *H01L 29/517* (2013.01); *H01L 29/518* (2013.01); *H01L 29/66545* (2013.01); *H01L 29/7851* (2013.01); *H01L 29/66636* (2013.01); *H01L 29/7848* (2013.01)

(58) Field of Classification Search
CPC .................................................. H01L 27/0924
See application file for complete search history.

(56) References Cited

U.S. PATENT DOCUMENTS

| 9,087,886 B2 | 7/2015 | Kim |
| 9,093,467 B1 | 8/2015 | Xie et al. |
| 10,032,774 B2 * | 7/2018 | Chang ............. H01L 21/823821 |

FOREIGN PATENT DOCUMENTS

| TW | 201034168 A | 9/2010 |
| TW | 201436102 A | 9/2014 |

* cited by examiner

*Primary Examiner* — William Coleman
(74) *Attorney, Agent, or Firm* — Cooper Legal Group, LLC

(57) ABSTRACT

A semiconductor device includes a semiconductor substrate and at least one gate stack. The gate stack is present on the semiconductor substrate, and the gate stack includes at least one work function conductor and a filling conductor. The work function conductor has a recess therein. The filling conductor includes a plug portion and a cap portion. The plug portion is present in the recess of the work function conductor. The cap portion caps the work function conductor.

20 Claims, 16 Drawing Sheets

Related U.S. Application Data continuation of application No. 15/135,476, filed on Apr. 21, 2016, now Pat. No. 9,780,092.

(60) Provisional application No. 62/297,750, filed on Feb. 19, 2016.

(51) Int. Cl.
*H01L 29/49* (2006.01)
*H01L 29/51* (2006.01)
*H01L 29/66* (2006.01)

SEMICONDUCTOR DEVICE AND MANUFACTURE METHOD THEREOF

PRIORITY CLAIM AND CROSS-REFERENCE

This application is a continuation of and claims priority to U.S. Non-Provisional application Ser. No. 15/722,229, titled "SEMICONDUCTOR DEVICE AND MANUFACTURING METHOD THEREOF" and filed on Oct. 2, 2017, which claims priority to U.S. Non-Provisional application Ser. No. 15/135,476, now titled "SEMICONDUCTOR DEVICE HAVING A FILLING CONDUCTOR COMPRISING A PLUG PORTION AND A CAP PORTION AND MANUFACTURING METHOD THEREOF" and filed on Apr. 21, 2016, which claims priority to U.S. Provisional Application Ser. No. 62/297,750, titled "FINFET METAL GATE ETCH BACK PROCESS" and filed on Feb. 19, 2016. U.S. Non-Provisional application Ser. No. 15/722,229, U.S. Non-Provisional application Ser. No. 15/135,476, and U.S. Provisional Application Ser. No. 62/297,750 are incorporated herein by reference.

BACKGROUND

As the semiconductor industry has strived for higher device density, higher performance, and lower costs, problems involving both fabrication and design have been encountered. One solution to these problems has been the development of a fin-like field effect transistor (FinFET). A typical FinFET includes a thin vertical 'fin' formed by etching spaced recesses into a substrate. The source, drain, and channel regions are defined within this fin. The transistor's gate wraps around the channel region of the fin. This configuration allows the gate to induce current flow in the channel from three sides. Thus, FinFET devices have the benefit of higher current flow and reduced short-channel effects.

The dimensions of FinFETs and other metal oxide semiconductor field effect transistors (MOSFETs) have been progressively reduced as technological advances have been made in integrated circuit materials, and high-k metal gate (HKMG) processes have been applied to FinFETs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
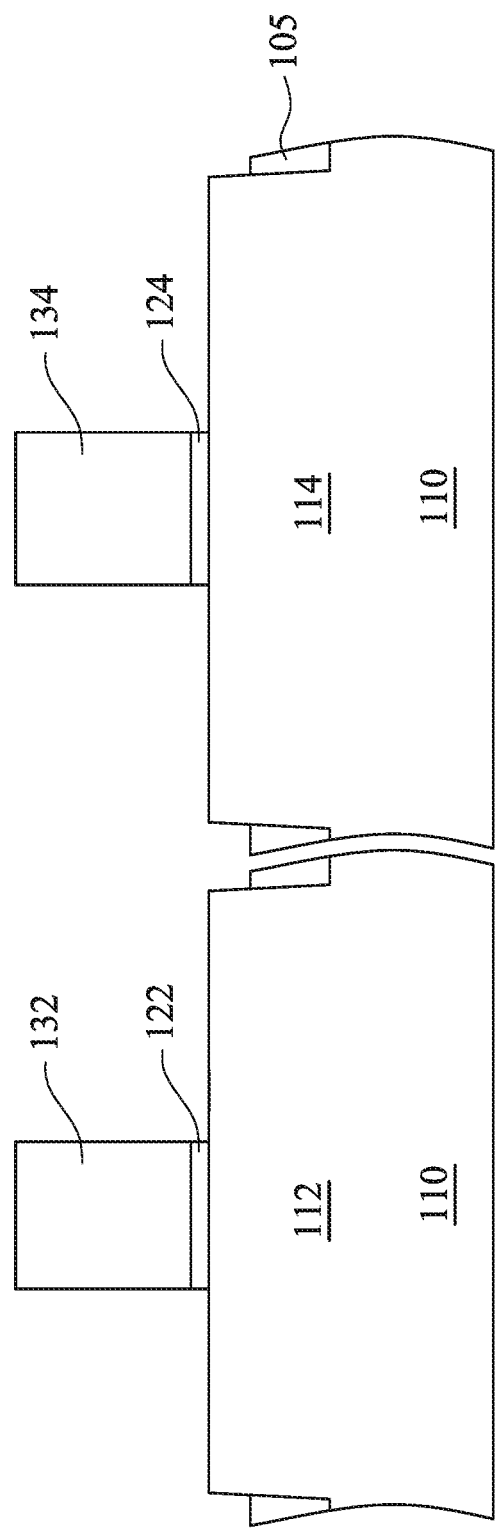
FIG. 1 to FIG. 16 are cross-sectional views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of devices that can be improved from one or more embodiments of the present application are semiconductor devices. Such a device, for example, is a Fin field effect transistor (FinFET) device. The following disclosure will continue with a FinFET example to illustrate various embodiments of the present application. It is understood, however, that the application should not be limited to a particular type of device.

FIG. 1 to FIG. 16 are cross-sectional views of a method for manufacturing a semiconductor device at various stages in accordance with some embodiments of the present disclosure. Reference is made to FIG. 1. A substrate 110 is provided. In some embodiments, the substrate 110 includes silicon. Alternatively, the substrate 110 may include germanium, silicon germanium, gallium arsenide or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 110 may include a semiconductor-on-insulator (SOI) structure. Also alternatively, the substrate 110 may include a buried dielectric layer, such as a buried oxide (BOX) layer, such as that formed by separation by implantation of oxygen (SIMOX) technology, wafer bonding, SEG, or other appropriate method.

Semiconductor fins 112 and 114 are formed on the substrate 110. In some embodiments, the semiconductor fins 112 and 114 include silicon. The semiconductor fins 112 and 114 may be formed, for example, by patterning and etching the substrate 110 using photolithography techniques. In some embodiments, a layer of photoresist material (not shown) is sequentially deposited over the substrate 110. The layer of photoresist material is irradiated (exposed) in accordance with a desired pattern (the semiconductor fins 112 and 114 in this case) and developed to remove portions of the photoresist material. The remaining photoresist material protects the underlying material from subsequent processing steps, such as etching. It is noted that other masks, such as an oxide or silicon nitride mask, may also be used in the etching process.

An isolation dielectric 105 is formed to fill trenches between the semiconductor fins 112 and 114 as shallow trench isolation (STI). The isolation dielectric 105 may include any suitable dielectric material, such as silicon oxide. The method of forming the isolation dielectric 105 may include depositing an isolation dielectric 105 on the substrate 110 to cover the semiconductor fins 112 and 114, optionally performing a planarization process to remove the excess isolation dielectric 105 outside the trenches, and then performing an etching process on the isolation dielectric 105 until upper portions of the semiconductor fins 112 and 114 are exposed.

Gate dielectrics 122 and 124 are formed on the semiconductor fins 112 and 114 and the substrate 110, respectively. The gate dielectrics 122 and 124 may be formed by thermal oxidation, chemical vapor deposition, sputtering, or other methods known and used in the art for forming a gate dielectric. Depending on the technique of dielectric layer formation, the thickness of the gate dielectric 122 on the top of the semiconductor fin 112 may be different from the thickness of the gate dielectric 122 on the sidewall (not shown) of the semiconductor fin 112. Similarly, the thickness of the gate dielectric 124 on the top of the semiconductor fin 114 may be different from the thickness of the gate dielectric 124 on the sidewall (not shown) of the semiconductor fin 114. The gate dielectrics 122 and 124 can be patterned to respectively wrap central portions of the semiconductor fins 112 and 114 and respectively expose portions of the semiconductor fins 112 and 114. At least one of the gate dielectrics 122 and 124 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, at least one of the gate dielectrics 122 and 124 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. At least one of the gate dielectrics 122 and 124 may have a multilayer structure such as one layer of silicon oxide (e.g., interfacial layer) and another layer of high-k material. At least one of the gate dielectrics 122 and 124 may be formed using chemical vapor deposition (CVD), physical vapor deposition (PVD), atomic layer deposition (ALD), thermal oxide, ozone oxidation, other suitable processes, or combinations thereof.

Dummy gate layers 132 and 134 are respectively formed on the gate dielectrics 122 and 124. At least one of the dummy gate layers 132 and 134 may be formed by CVD, sputter deposition, or by other suitable technique for depositing conductive materials. The dummy gate layers 132 and 134 can be patterned to respectively wrap central portions of the semiconductor fins 112 and 114 and respectively expose portions of the semiconductor fins 112 and 114. In some embodiments, the gate dielectric 122 and the dummy gate layer 132 formed thereon may be patterned by the same process. Similarly, the gate dielectric 124 and the dummy gate layer 134 may be patterned by the same process. At least one of the dummy gate layers 132 and 134 may include polycrystalline-silicon (poly-Si) or poly-crystalline silicon-germanium (poly-SiGe).

Figure 2:
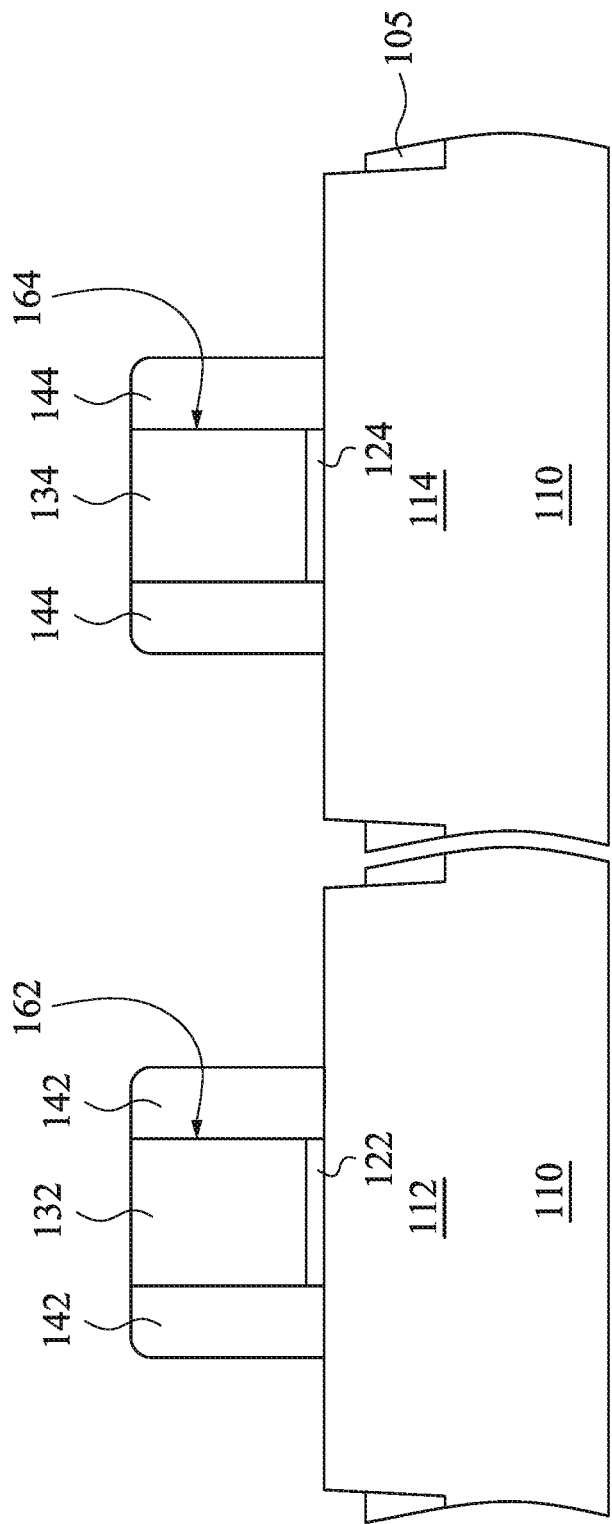

Reference is made to FIG. 2. A pair of gate spacers 142 is formed on the substrate 110 and along the dummy gate structure 132, and a pair of gate spacers 144 is formed on the substrate 110 and along the dummy gate structure 134. In some embodiments, the gate spacers 142 and 144 may include silicon oxide, silicon nitride, silicon oxy-nitride, or other suitable material. The gate spacers 142 and 144 may include a single layer or multilayer structure. To form the gate spacers 142 and 144, a blanket layer may be formed on the substrate 110 by CVD, PVD, ALD, or other suitable technique. Then, an anisotropic etching is performed on the blanket layer to form the gate spacers 142 and 144 respectively on opposite sides of the dummy gate structures 132 and 134. In some embodiments, the gate spacers 142 and 144 are used to offset subsequently formed doped regions, such as source/drain regions. The gate spacers 142 and 144 may further be used for designing or modifying the source/drain region (junction) profile.

Figure 3:
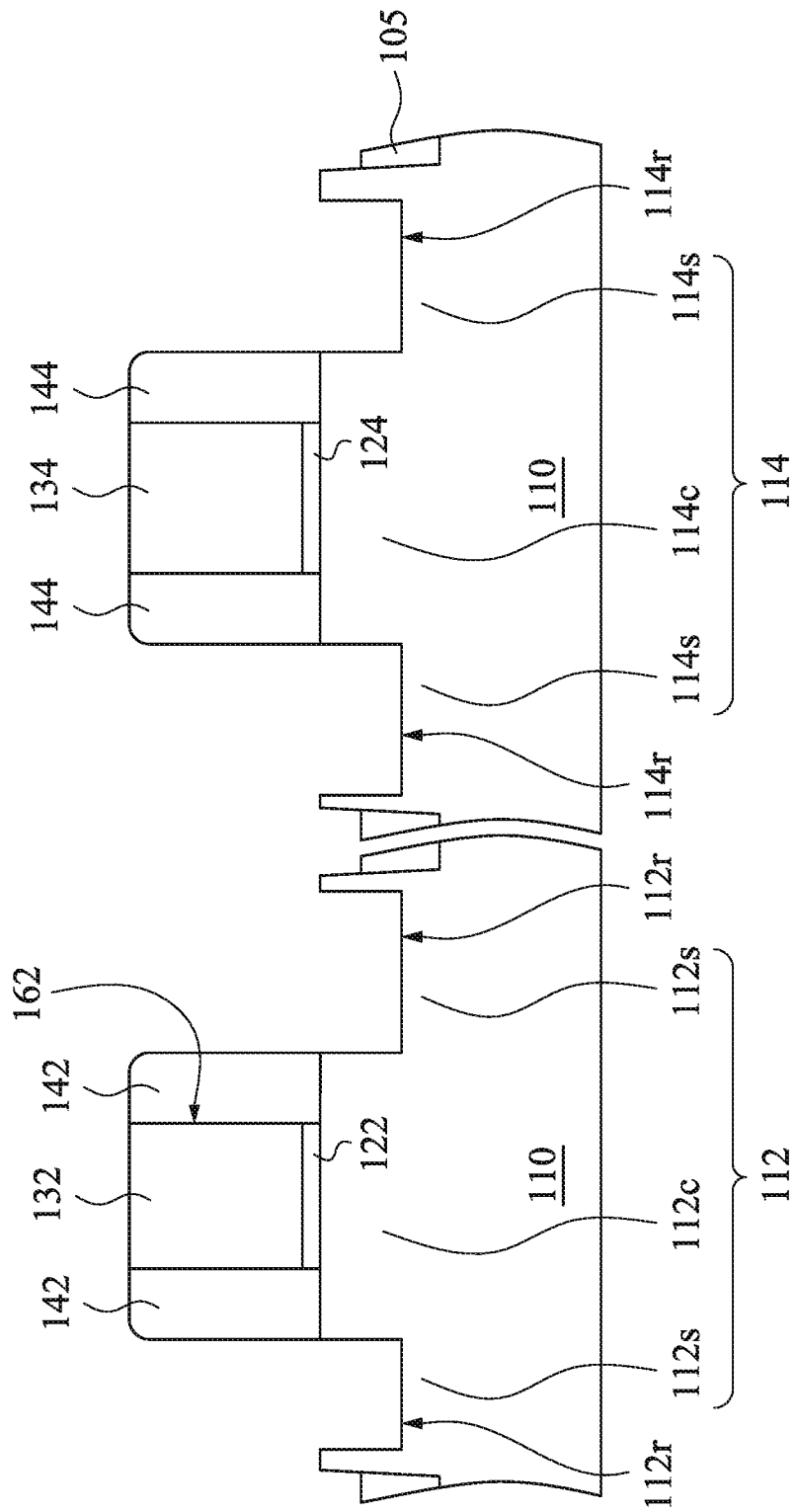

Reference is made to FIG. 3. Portions of the semiconductor fins 112 and 114 exposed both by the dummy gate structures 132 and 134 and the gate spacers 142 and 144 are removed (or recessed) to form recesses 112r and 114r in the substrate 110. Any suitable amount of material may be removed. The remaining semiconductor fin 112 has a plurality of source/drain portions 112s and a channel portion 112c between the source/drain portions 112s. The remaining semiconductor fin 114 has a plurality of source/drain portions 114s and a channel portion 114c between the source/drain portions 114s. The source/drain portions 112s and 114s are embedded in the substrate 110 and portions thereof are exposed by the recesses 112r and 114r. The channel portions 112c and 114c respectively underlie the dummy gate structures 132 and 134.

Removing portions of the semiconductor fins 112 and 114 may include forming a photoresist layer or a capping layer (such as an oxide capping layer) over the structure of FIG. 2, patterning the photoresist or capping layer to have openings that expose portions of the semiconductor fins 112 and 114, and etching the exposed portions of the semiconductor fins 112 and 114. In some embodiments, the semiconductor fins 112 and 114 can be etched using a dry etching process. Alternatively, the etching process is a wet etching process, or combination dry and wet etching process. Removal may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet some other embodiments, the lithography process could implement nanoimprint technology. In some embodiments, a pre-cleaning process may be performed to clean the recesses 112r and 114r with HF or other suitable solution.

Figure 4:
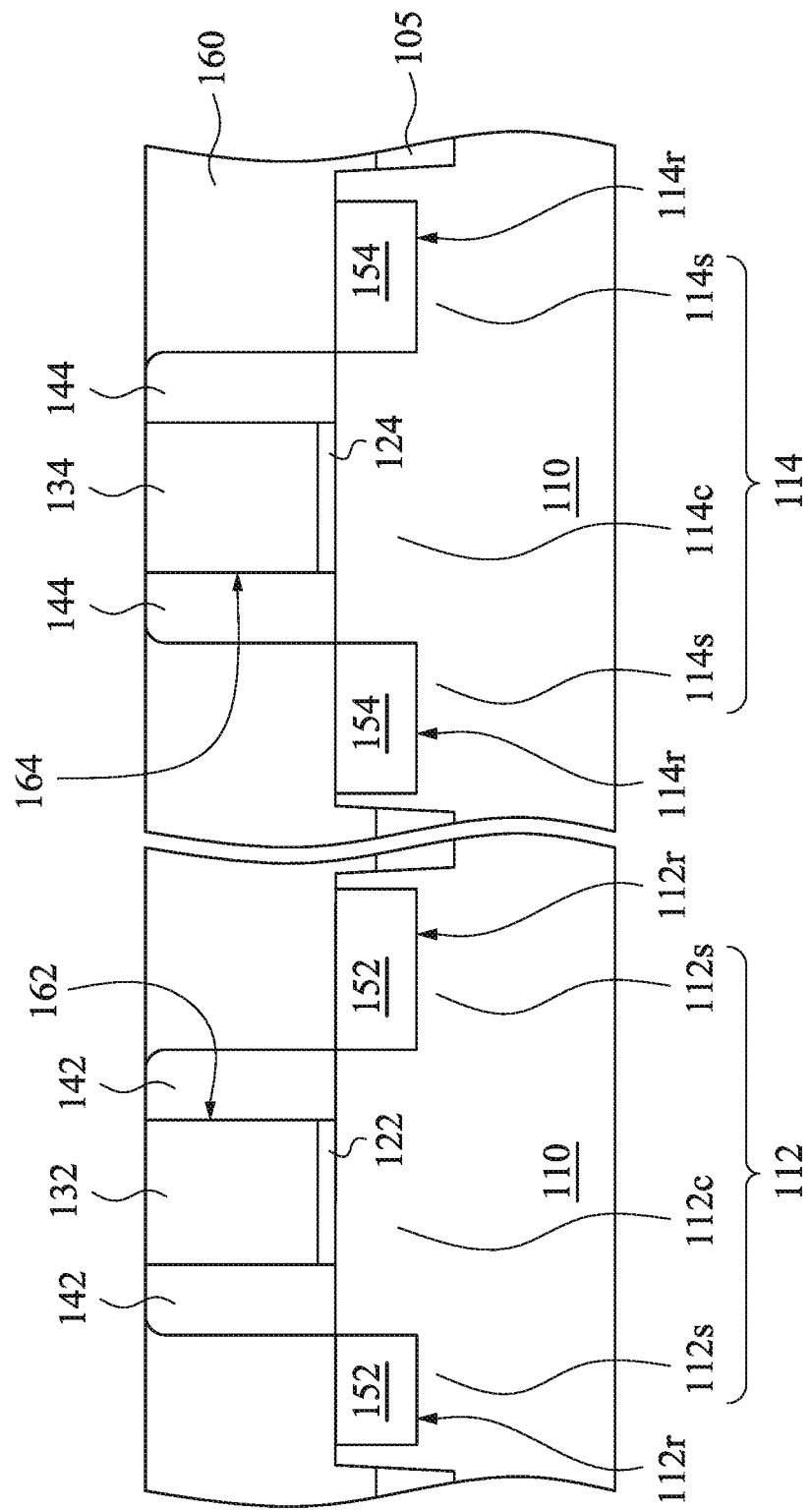

Reference is made to FIG. 4. A plurality of epitaxy structures 152 and 154 are respectively formed in the recesses 112r and 114r and on the source/drain portions 112s and 114s of the semiconductor fins 112 and 114. The epitaxy structures 152 and 154 may be formed using one or more epitaxy or epitaxial (epi) processes, such that Si features, SiGe features, and/or other suitable features can be formed in a crystalline state on the source/drain portions 112s and 114s of the semiconductor fins 112 and 114. In some embodiments, the lattice constant of the epitaxy structures 152 and 154 are different from the lattice constant of the semiconductor fins 112 and 114, so that the channels of the semiconductor fins 112 and 114 can be strained or stressed by the epitaxy structures 152 and 154 to improve carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the source/drain portions 112s and 114s of the semiconductor fins 112 and 114 (e.g., silicon). Thus, a strained channel can be achieved to increase carrier mobility and enhance device performance. The epitaxy structures 152 and 154 may be in-situ doped. The doping species include P-type dopants, such as boron or $BF_2$; N-type dopants, such as phosphorus or arsenic; and/or other suitable dopants including combinations thereof. If the epitaxy structures 152 and 154 are not in-situ doped, a second implantation process (i.e., a junction implant process) is performed to dope the epitaxy structures 152 and 154. One or more annealing processes may be performed to activate the epitaxy structures 152 and 154. The annealing processes include rapid thermal annealing (RTA) and/or laser annealing processes.

Thereafter, an interlayer dielectric (ILD) layer 160 is formed at outer sides of the gate spacers 142 and 144 and on the substrate 110. The ILD layer 160 includes silicon oxide, silicon nitride, silicon oxynitride, silicon carbide, low-dielectric constant dielectric material or a combination thereof. The ILD layer 160 includes a single layer or multiple layers. The ILD layer 160 is formed by a suitable technique, such as CVD. A chemical mechanical planarization (CMP) process may be applied to remove excessive ILD layer 160 and expose top surfaces of the dummy gate structures 132 and 134 to a subsequent dummy gate removal process.

Figure 5:
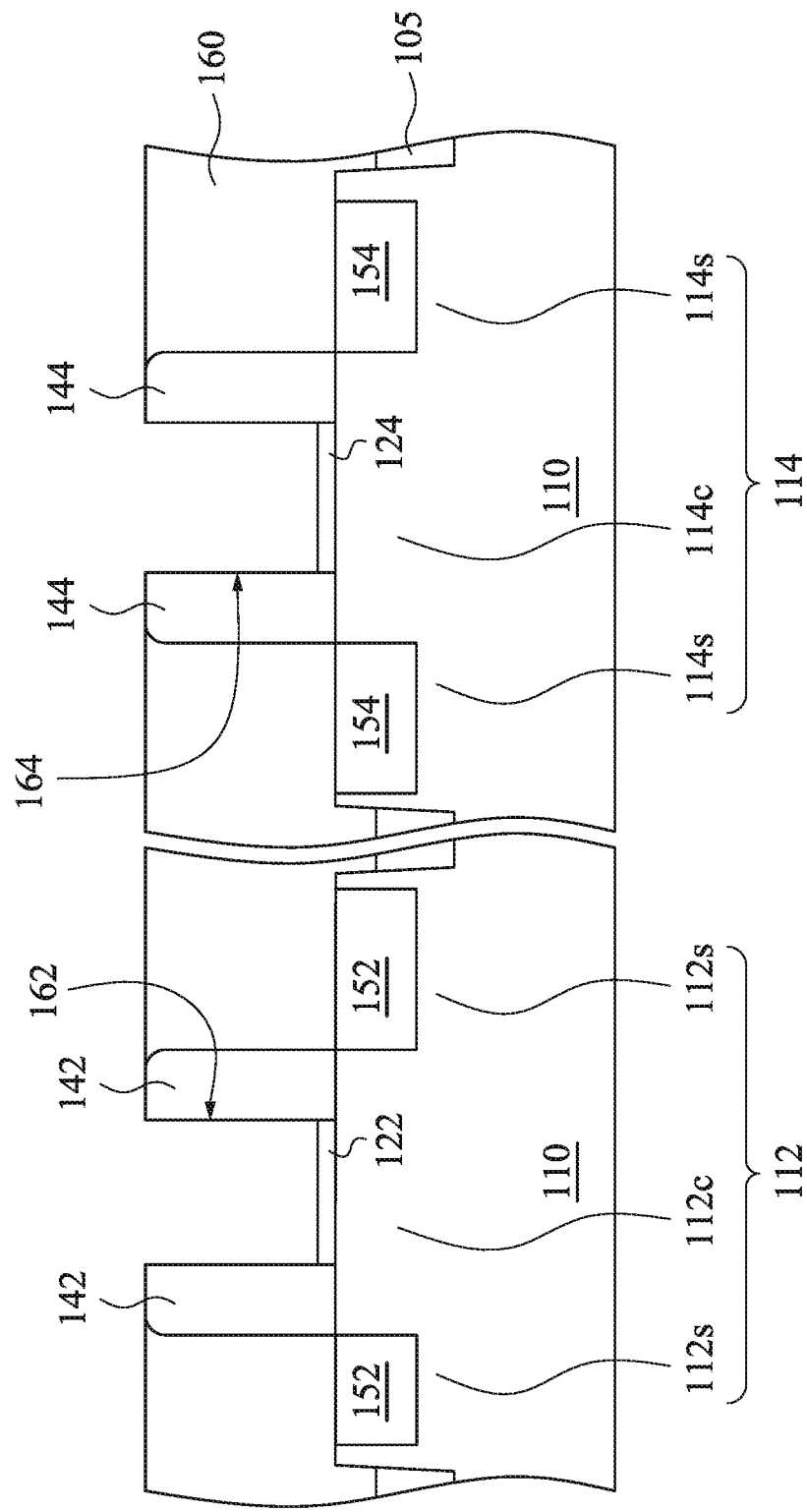

Reference is made to FIG. 5. The dummy gate structures 132 and 134 (see FIG. 4) are removed to form an opening 162 with the gate spacers 142 as its sidewall and an opening 164 with the gate spacers 144 as its sidewall. In some embodiments, the gate dielectrics 122 and 124 are removed as well. Alternatively, in some embodiments, the dummy gate structures 132 and 134 are removed while the gate dielectrics 122 and 124 retain as shown in FIG. 5. The dummy gate structures 132 and 134 (and the gate dielectrics 122 and 124) may be removed by dry etch, wet etch, or a combination of dry and wet etch. For example, a wet etch process may include exposure to a hydroxide containing solution (e.g., ammonium hydroxide), deionized water, and/or other suitable etchant solutions.

Figure 6:
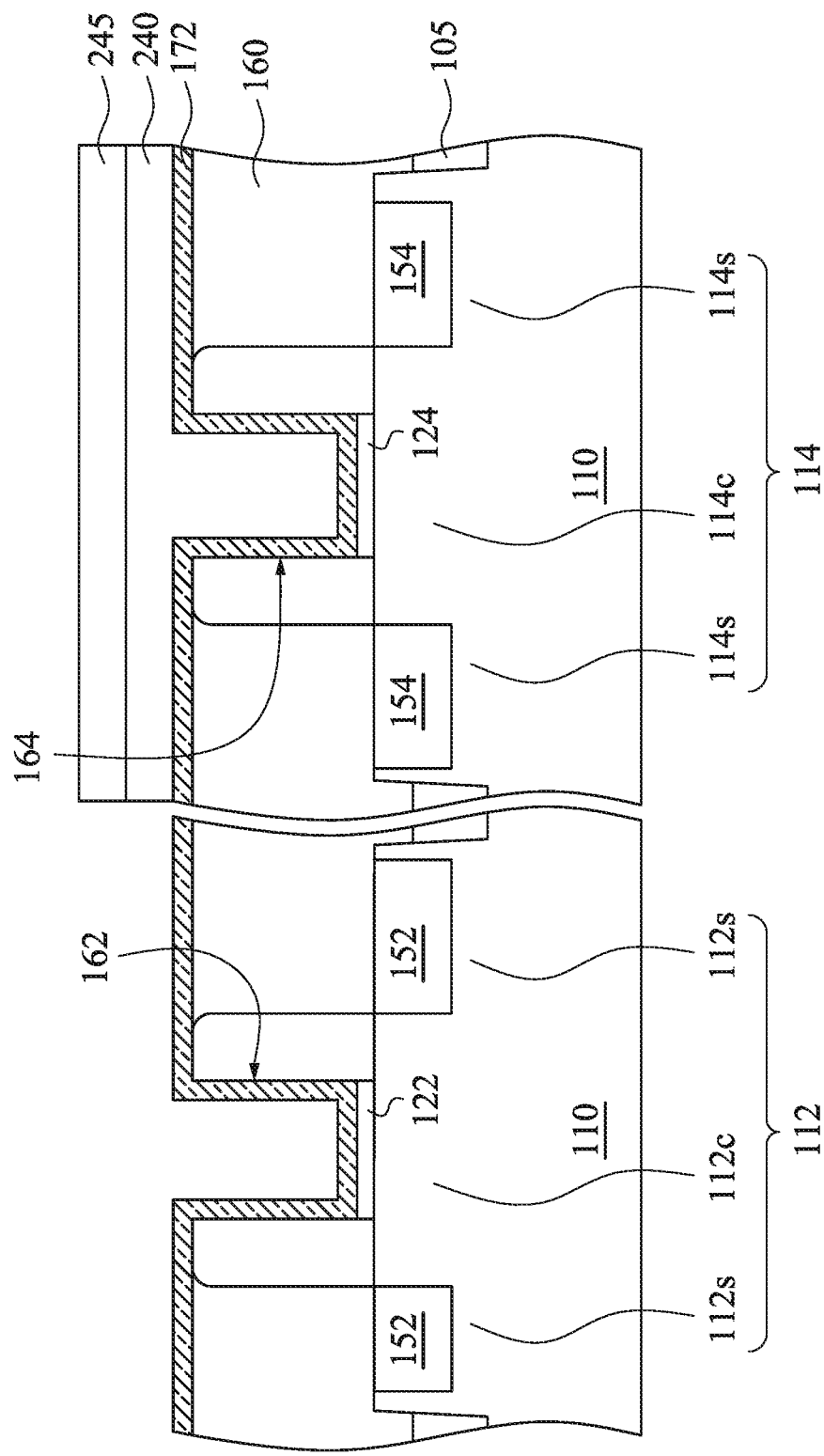

Reference is made to FIG. 6. A P-type work function material 172 can be formed on the structure shown in FIG. 5. The P-type work function material 172 can provide a desired work function value for a P-type gate stack of a P-type semiconductor device. The P-type work function material 172 can be formed by suitable process, such as ALD, CVD, PVD, remote plasma CVD (RPCVD), plasma enhanced CVD (PECVD), metal organic CVD (MOCVD), sputtering, plating, other suitable processes, and/or combinations thereof. In some embodiments, the P-type work function material 172 can be made of TiN, Co, WN, or TaC.

A dielectric material 240, e.g. spin-on-glass (SOG), can be formed, covering a portion of the P-type work function material 172 and filling the opening 164. A photoresist 245 can be defined over the dielectric material 240. The dielectric material 240 and/or the photoresist 245 can be provided for patterning the P-type work function material 172 for the P-type semiconductor device. The dielectric material 240 and the photoresist 245 can be defined by, for example, a spin-on process, a photolithographic process, and an etch process.

Figure 7:
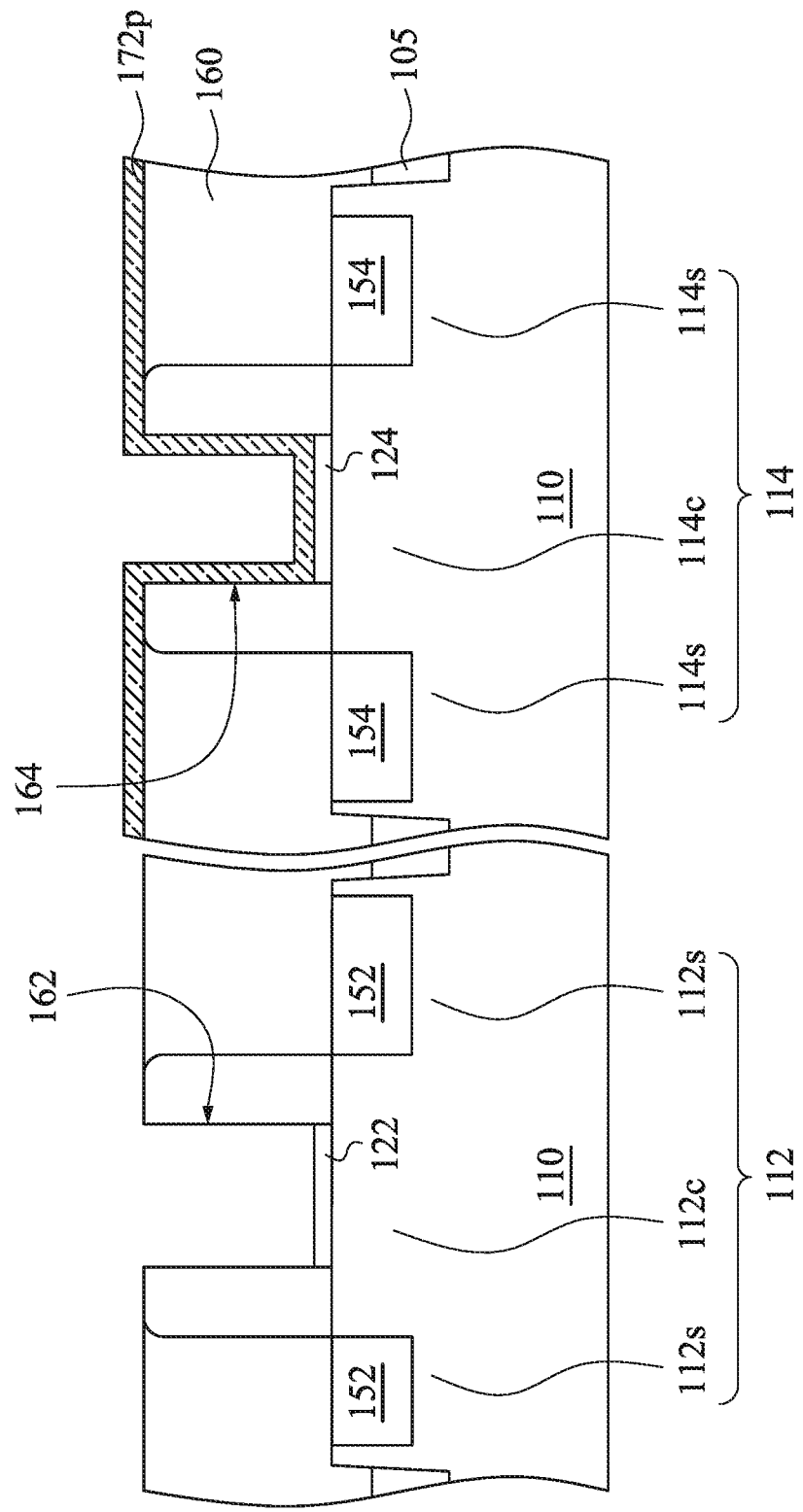

Reference is made to FIG. 7. A portion of the P-type work function material 172 that is not covered by the dielectric material 240 and the photoresist 245 of FIG. 6 can be removed, defining a P-type work function conductor layer 172p. After defining the P-type work function conductor layer 172p, the dielectric material 240 and the photoresist 245 of FIG. 6 can be removed by a wet etch process, a dry etch process, and/or combinations thereof, exposing the P-type work function conductor layer 172p.

Figure 8:
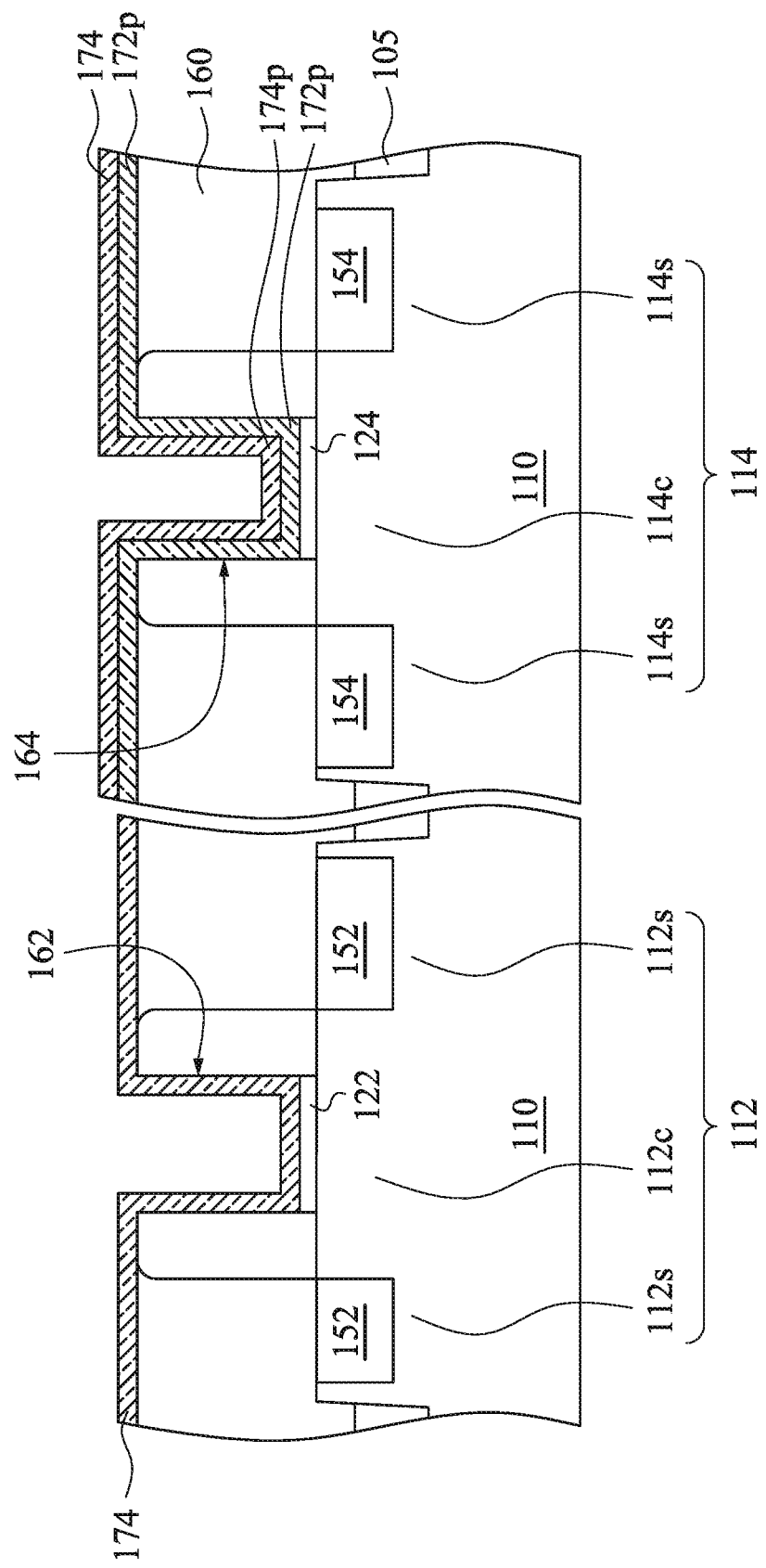

Reference is made to FIG. 8. An N-type work function material 174 can be formed on the structure shown in FIG. 7. The N-type work function material 174 can provide a desired work function value for an N-type gate stack of an N-type semiconductor device. The N-type work function material 174 can be formed by suitable process, such as ALD, CVD, PVD, remote plasma CVD (RPCVD), plasma enhanced CVD (PECVD), metal organic CVD (MOCVD), sputtering, plating, other suitable processes, and/or combinations thereof. In some embodiments, the N-type work function material 174 can be made of Ti, Al, or TiAl.

Figure 9:
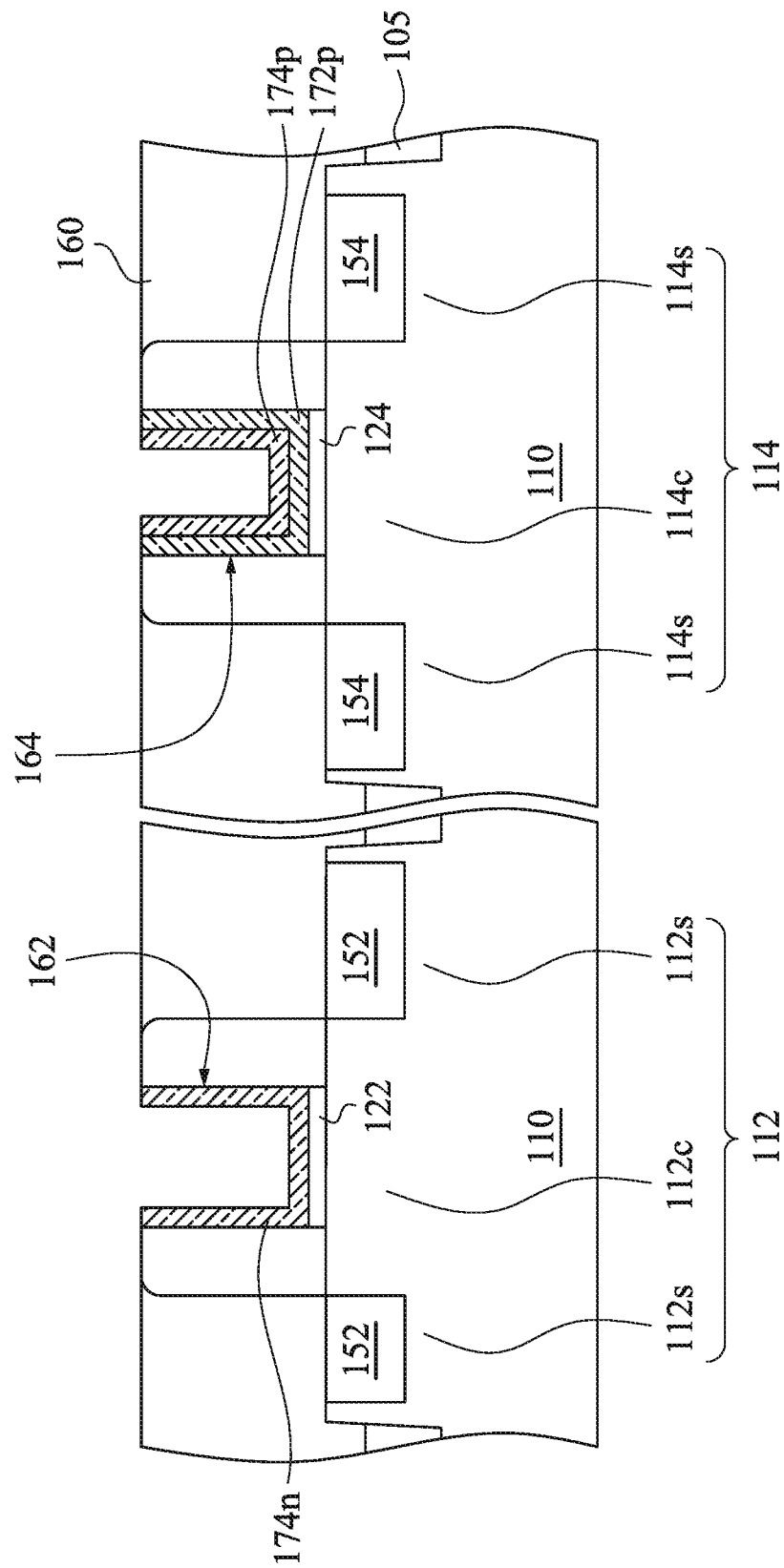

Reference is made to FIG. 9. a CMP process is applied to remove excessive portions of the P-type work function conductor layer 172p and the N-type work function material 174 outside the openings 162 and 164 to provide a substantially planar top surface for the P-type work function conductor layer 172p, the N-type work function conductor layers 174n and 174p. The remaining N-type work function conductor layer 174n is present in the opening 162. The remaining P-type work function conductor layer 172p and the N-type work function conductor layer 174p are present in the opening 164.

Figure 10:
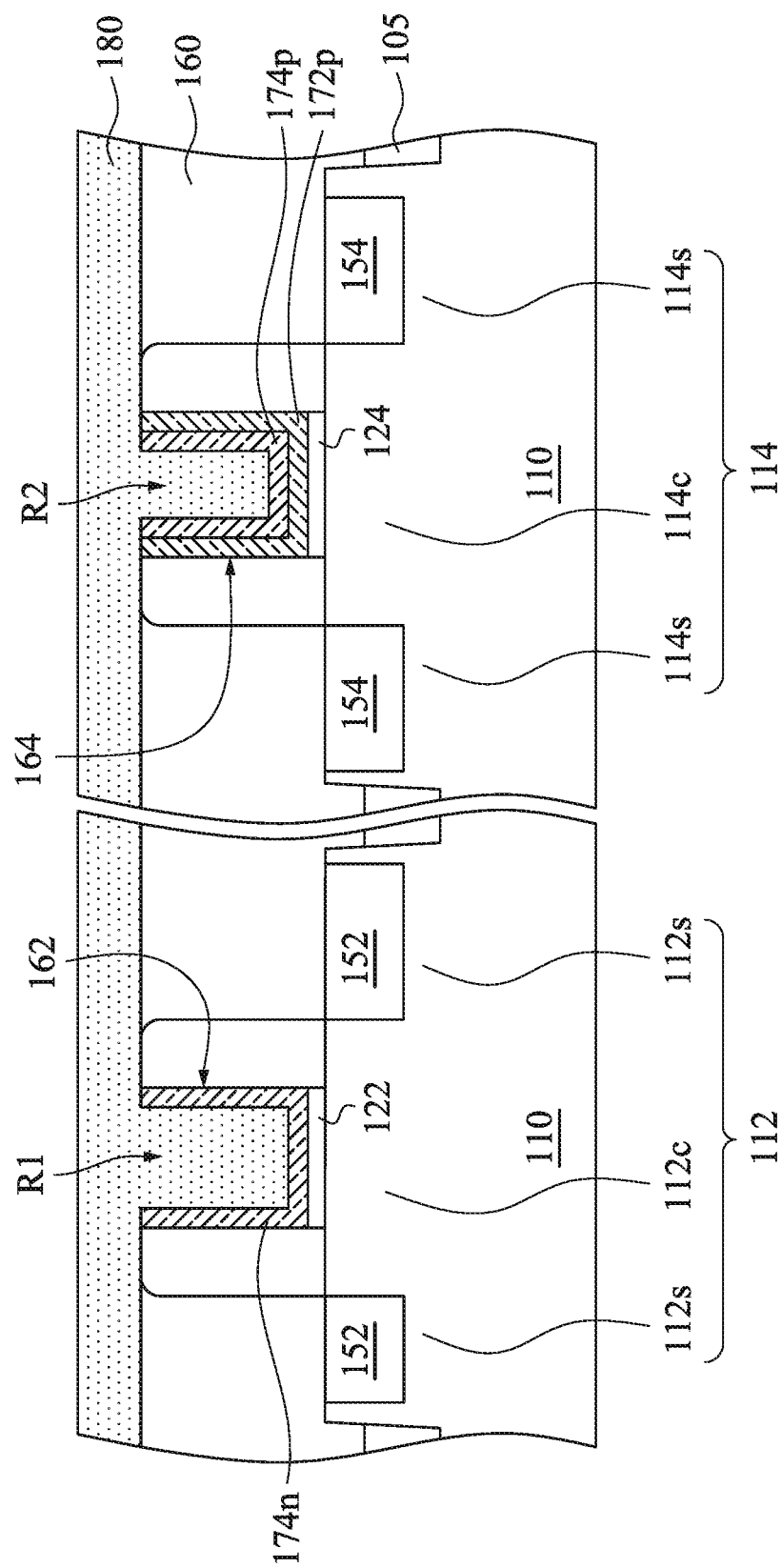

Reference is made to FIG. 10. A mask 180 is formed on the structure shown in FIG. 9. In particular, the work function conductor in the opening 162, which includes the N-type work function conductor layer 174n, has a recess R1 therein. The work function conductor in the opening 164, which includes the N-type work function conductor layer 174p and the N-type work function conductor layer 172p, has a recess R2 therein. The mask 180 may serve as a filling layer that is at least formed in the lower portions of the recesses R1 and R2. Such a filling layer may protect the underlying work function conductors from the subsequent etching process performed to the upper portions of the work function conductors. In some embodiments, the mask 180 overfills the recesses R1 and R2. In some embodiments, the mask 180 may be a hard mask, which includes silicon nitride, silicon oxynitride, silicon carbide, and/or other suitable materials. The mask 180 may be formed using methods such as CVD or PVD.

Figure 11:
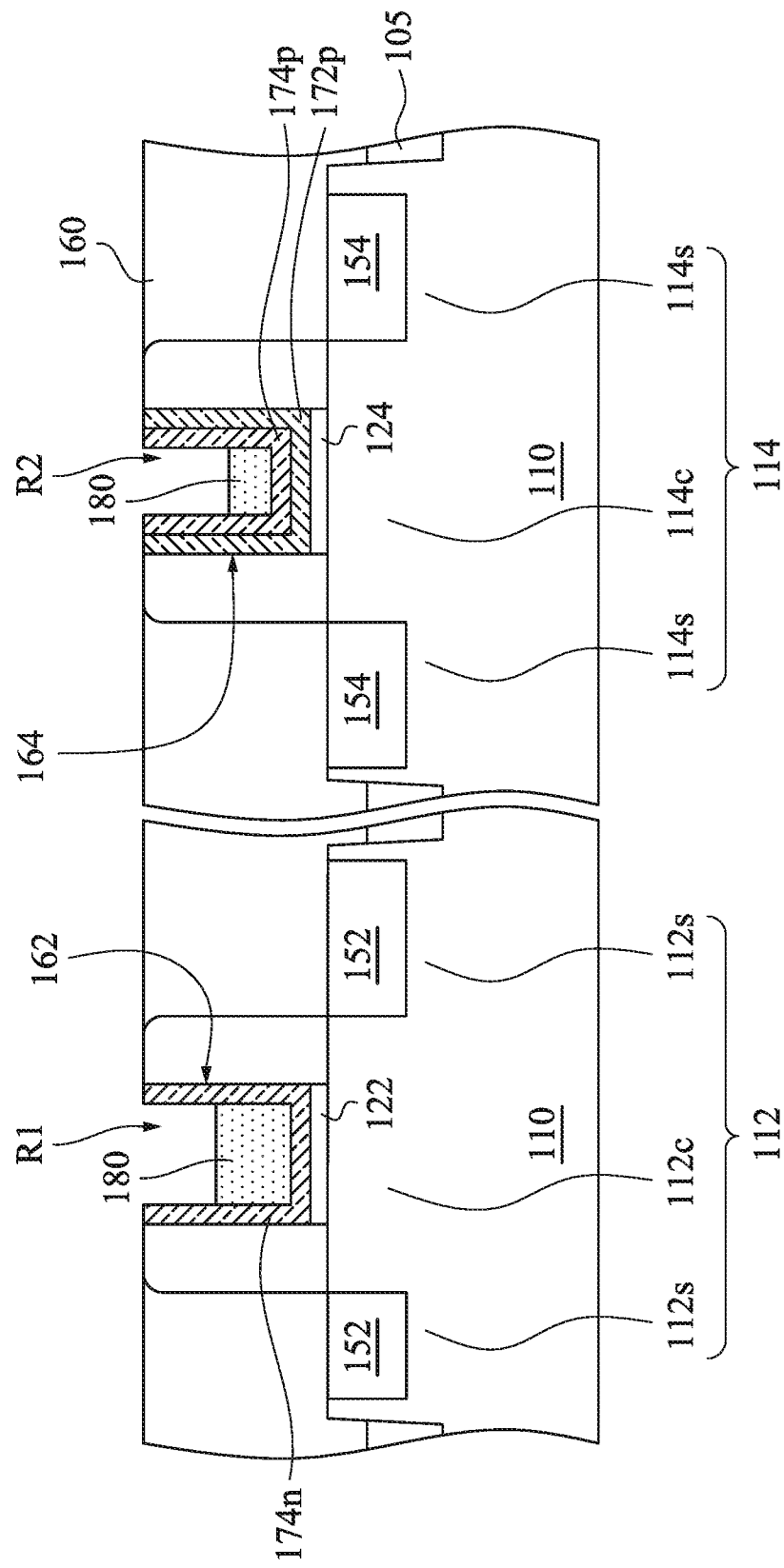

Reference is made to FIG. 11. Portions of the mask 180 are removed to expose at least top surfaces of the work function conductors in the opening 162 and 164, so as to benefit the subsequent etching process performed to the work function conductors in the openings 162 and 164. Stated differently, the mask 180 serving as the filling layer in the recesses R1 and R2 is recessed to expose portions of the work function conductors in the openings 162 and 164. In particular, the top surface of the N-type work function conductor layer 174n in the opening 162 is exposed after the removing the overlying portion of the mask 180. Similarly, the top surfaces of the N-type work function conductor layer 174p and the P-type work function conductor layer 172p are exposed after the removing the overlying portions of the mask 180. In some embodiments, upper portions of the mask 180 are removed to expose at least top surfaces of the work function conductors, and lower portions of the mask 180 are remained in the recesses R1 and R2 to protect the underlying work function conductors after the removal process. An exemplary method of removing upper portions of the mask 180 may be an etching back process.

Figure 12:
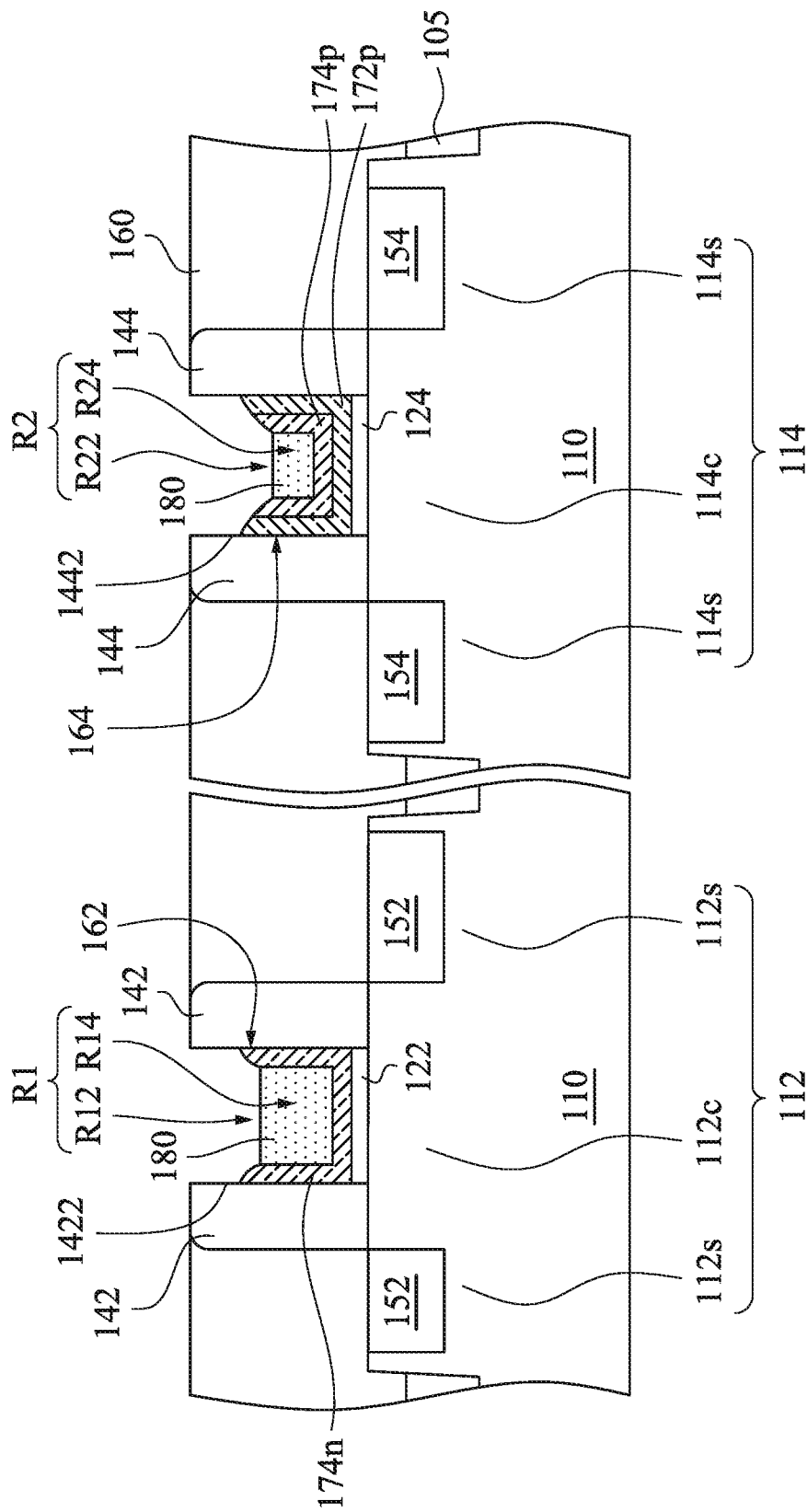

Reference is made to FIG. 12. The work function conductors in the opening 162 and 164 are recessed to expose at least portions of sidewalls 1422 and 1442 of the gate spacers 142 and 144. In particular, each of the gate spacers 142 has a sidewall 1422, and the sidewalls 1422 of the gate spacers 142 are opposite and define the opening 162 therebetween. The N-type work function conductor layer 174n in the opening 162 and between the sidewalls 1422 of the gate spacers 142 is recessed, so that upper portions of the sidewalls 1422 are exposed. Similarly, each of the gate spacers 144 has a sidewall 1442, and the sidewalls 1442 of the gate spacers 144 are opposite and define the opening 164 therebetween. The N-type work function conductor layer 174p and the P-type work function conductor layer 172p in the opening 164 and between the sidewalls 1442 of the gate spacers 144 are recessed, so that upper portions of the sidewalls 1442 are exposed. After the recessing process, the top surface of the N-type work function conductor layer 174n in the opening 162 may be shaped such that the recess R1 has a tapering opening R12 and a bottom recess R14 that are communicated with each other. The bottom recess R14 is present between the tapering opening R12 and the semiconductor fin 112. The tapering opening R12 tapers toward the bottom recess R14. In other words, the tapering opening R12 has a width greater than that of the bottom recess R14, and the width of the tapering opening R12 is spatially various. Similarly, after the recessing process, the top surfaces of the N-type work function conductor layer 174p and the P-type work function conductor layer 172p in the opening 164 may be shaped such that the recess R2 has a tapering opening R22 and a bottom recess R24 that are communicated with each other. The bottom recess R24 is present between the tapering opening R22 and the semiconductor fin 114. The tapering opening R22 tapers toward a bottom recess R24. In other words, the tapering opening R22 has a width greater than that of the bottom recess R24, and the width of the tapering opening R22 is spatially various. An exemplary method of the recessing the work function conductors may include a wet etching process that selectively removes portions of the work function conductors (e.g., work function metal pull back process) that are not protected by the mask 180.

Figure 13:
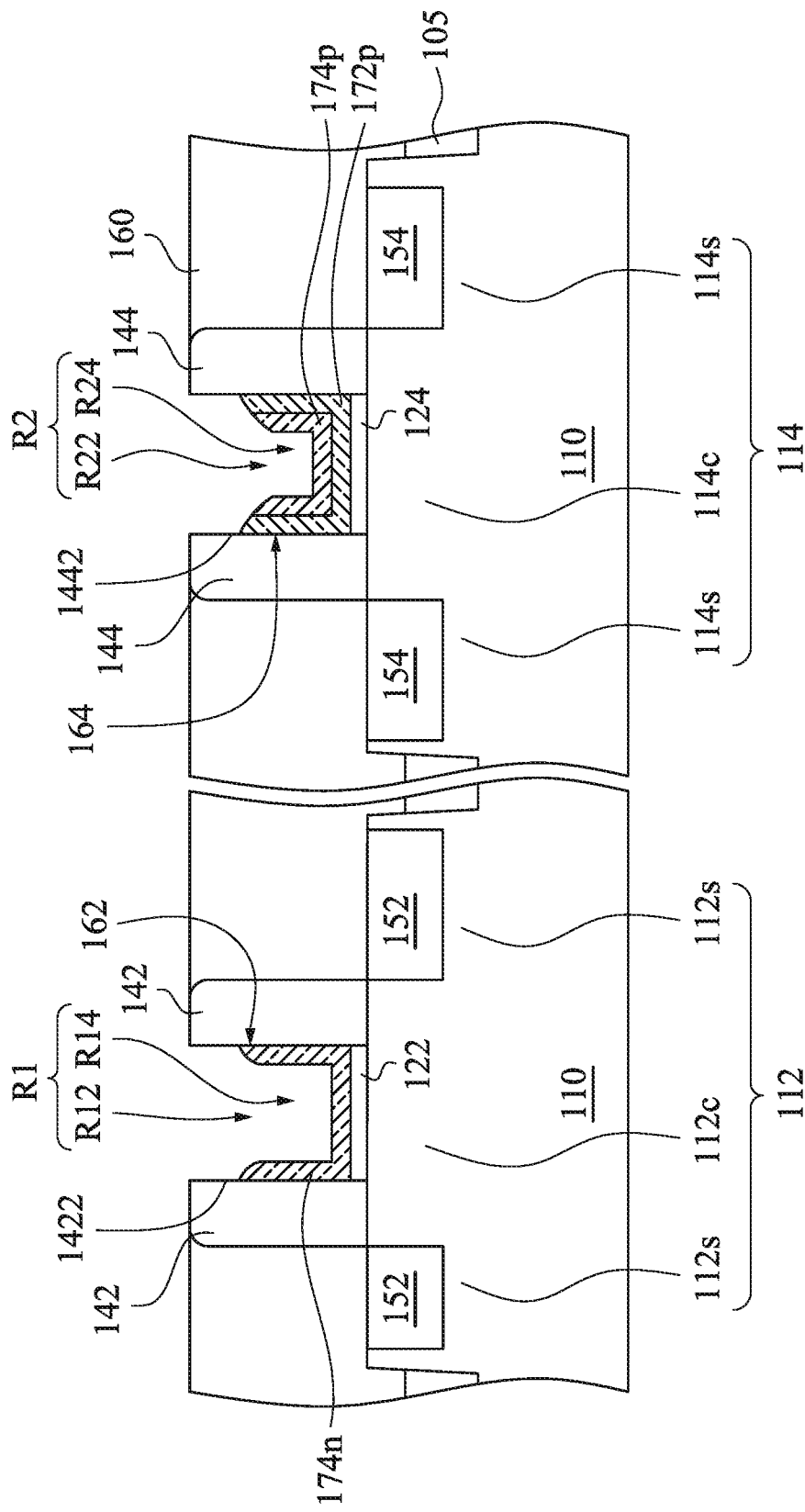

Reference is made to FIG. 13. The mask 180 (see FIG. 12) in the recesses R1 and R2 are removed to expose the recesses R1 and R2. In other words, a portion of the work function conductor underlying the mask 180 and in the opening 162 (namely, a bottom portion of the N-type work function conductor layer 174n) is exposed after this removal process. Similarly, a portion of the work function conductor underlying the mask 180 and in the opening 164 (namely, a bottom portion of the N-type work function conductor layer 174p) is exposed after this removal as well. An exemplary method of removing the mask 180 in the recesses R1 and R2 is wet etching which is able to selectively remove silicon nitride, and this wet etching utilizes hot (approximately 145° C. to 180° C.) phosphoric acid ($H_3PO_4$) solutions with water.

Figure 14:
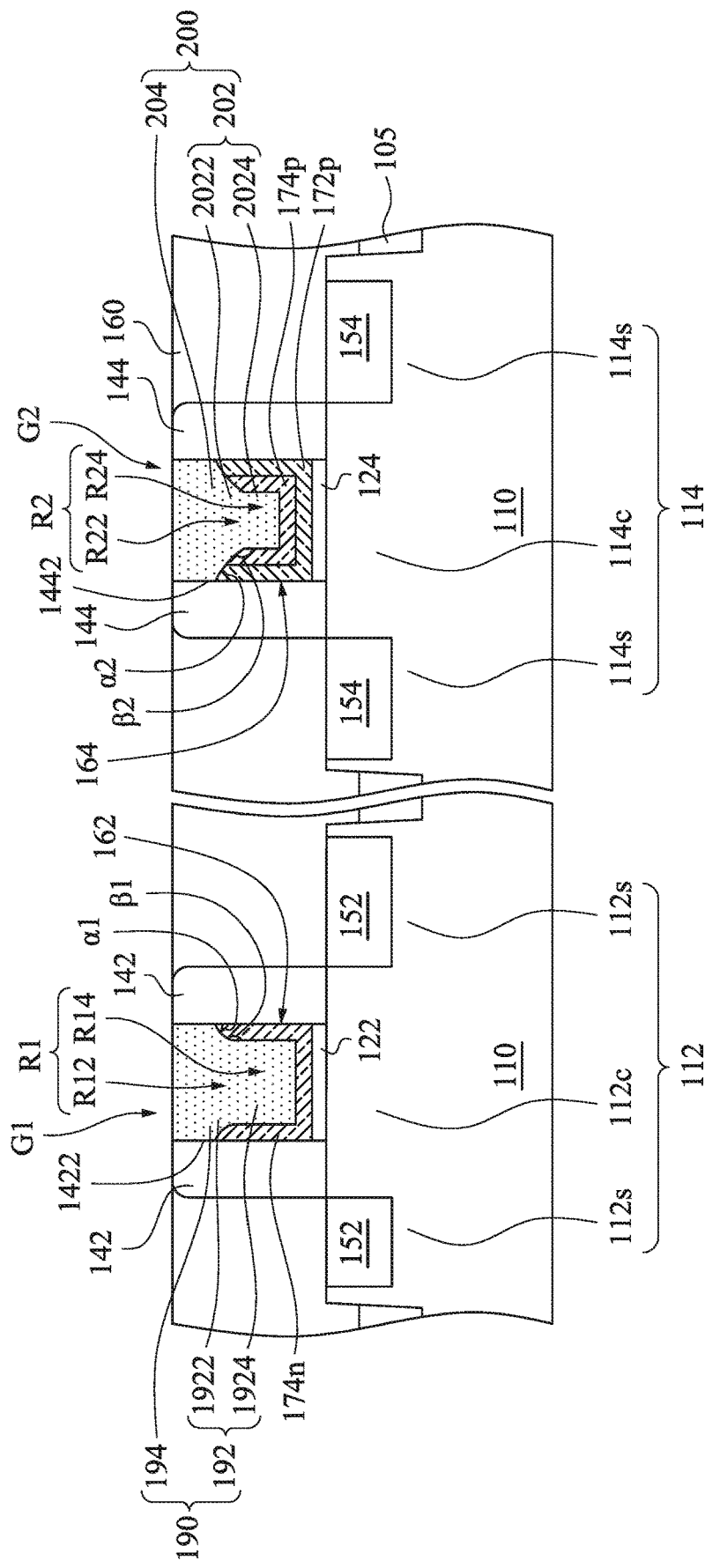

Reference is made to FIG. 14. A filling conductor 190 is formed in the recess R1 and a space between the exposed portions of the sidewalls 1422 of the gate spacers 142. In some embodiments, the forming the filling conductor 190 includes overfilling the recess R1 with the filling conductor 190 such that the filling conductor 190 reaches the exposed portions of the sidewalls 1422 of the gate spacers 142, and therefore, the filling conductor 190 has a plug portion 192 (or a tail portion) and a cap portion 194 (or a head portion) connected to each other. The plug portion 192 is present in the recess R1 of the work function conductor in the opening 162. The cap portion 194 caps the work function conductor in the opening 162. In particular, the plug portion 192 occupies the recess R1 of the N-type work function conductor layer 174n. The cap portion 194 caps the plug portion 192 and the N-type work function conductor layer 174n and may contact with the sidewalls 1422 of the gate spacers 142. Such an N-type work function conductor layer 174n and a filling conductor 190 may cooperatively serve as an N-type gate stack G1 for an N-type semiconductor device. In the N-type gate stack G1, since the cap portion 194 caps the N-type work function conductor layer 174n, the contact area of the N-type gate stack G1 may be increased, which may benefit a contact formed on the N-type gate stack G1, especially the cap portion 194.

Similarly, a filling conductor 200 is formed in the recess R2 and a space between the exposed portions of the sidewalls 1442 of the gate spacers 144. In some embodiments, the forming the filling conductor 200 includes overfilling the recess R2 with the filling conductor 200 such that the filling conductor 200 reaches the exposed portions of the sidewalls 1442 of the gate spacers 144, and therefore, the filling conductor 200 has a plug portion 202 (or a tail portion) and a cap portion 204 (or head portion) connected to each other. The plug portion 202 is present in the recess R2 of the work function conductor in the opening 164. The cap portion 204 caps the work function conductor in the opening 164. In particular, the plug portion 202 occupies the recess R2 of the N-type and P-type work function conductor layers 174p and 172p. The cap portion 204 caps the plug portion 202 and the N-type and P-type work function conductor layer 174p and 172p, and it may contact with the sidewalls 1442 of the gate spacers 144. Such an N-type and P-type work function conductor layer 174p and 172p and a filling conductor 200 may cooperatively serve as a P-type gate stack G2 for a P-type semiconductor device. In the P-type gate stack G2, since the cap portion 204 caps the N-type and P-type work function conductor layer 174p and 172p, the contact area of the P-type gate stack G2 may be increased, which may benefit a contact formed on the P-type gate stack G2, especially the cap portion 204.

In some embodiments, since the cap portion 194 of the filling conductor 190 of the N-type gate stack G1 overfills the recess R1 to reach the opposite sidewalls 1422, the cap portion 194 has a width equal to the distance between the opposite sidewalls 1422. Similarly, since the cap portion 204 of the P-type gate stack G2 overfills the recess R2 to reach the opposite sidewalls 1442, the cap portion 204 has a width equal to the distance between the opposite sidewalls 1442. In some embodiments, the distance between the opposite sidewalls 1422 and the distance between the opposite sidewalls 1442 may be the same, so that the cap portions 194 and 204 of the N-type gate stack G1 and the P-type gate stack G2 have substantially the same width, which may benefit the cap portions 194 and 204 to push against the underlying work function conductors even if the work function conductors of the N-type gate stack G1 and the P-type gate stack G2 are different. In other words, even if the work function conductor of the N-type gate stack G1 includes the N-type work function conductor layer 174n and the work function conductor of the P-type gate stack G2 includes both the N-type and P-type work function conductor layers 174p and 172p, the cap portions 194 and 204 having substantially the same width can provide optimized forces to push against the underlying work function conductors, respectively.

In some embodiments, since the work function conductor of the N-type gate stack G1 includes the N-type work function conductor layer 174n, and the work function conductor of the P-type gate stack G2 includes both the N-type and P-type work function conductor layers 174p and 172p, the work function conductors of the N-type and P-type gate stacks G1 and G2 have different shapes, and therefore, the recesses R1 and R2 have different widths. As such, the plug portions 192 and 202 of the filling conductors 190 and 200 of the N-type and P-type gate stacks G1 and G2 have different widths.

In some embodiments, since the cap portions 194 and 204 are respectively formed by overfilling the recesses R1 and R2, and the plug portions 192 and 202 are respectively present in the recesses R1 and R2, the widths of the cap portions 194 and 204 are greater than that of the plug portions 192 and 202, which may benefit increasing the contact areas of the N-type and P-type gate stacks G1 and G2. Stated differently, the widths of the cap portions 194 and 204 are not less than that of the work function conductors in the openings 162 and 164 respectively, so that the contact areas of the N-type and P-type gate stacks G1 and G2 may be increased. In particular, the width of the cap portion 194 is not less than that of the N-type work function layer 174n of the N-type gate stack G1, and the width of the cap portion 204 is that less than that of the P-type work function layer 172p of the P-type gate stack G2.

In some embodiments, since the cap portions 194 and 204 are respectively formed by overfilling the recesses R1 and R2 to reach the sidewalls 1422 and 1442, the work function conductor in the opening 162 is absent on at least one sidewall of the cap portion 194, and the work function conductor in the opening 164 is absent on at least one sidewall of the cap portion 204 as well. In other words, the gate spacer 142 is present on at least one sidewall of the N-type gate stack G1, and the work function conductor of the N-type gate stack G1 (including the N-type work function conductor layer 174n) is absent between the cap portion 194 and the gate spacer 142. Similarly, the gate spacer 144 is present on at least one sidewall of the P-type gate stack G2, and the work function conductor of the P-type gate stack G2 (including the N-type and P-type work function conductor layers 174p and 172p) is absent between the cap portion 204 and the gate spacer 144.

In some embodiments, since the plug portions 192 and 202 respectively occupy the recesses R1 and R2, the plug portions 192 and 202 may have shapes the same as that of the recesses R1 and R2. In particular, the plug portion 192 may include a tapering plug 1922 and a bottom plug 1924 connected to each other. The tapering plug 1922 is present between the cap portion 194 and the bottom plug 1924. The tapering plug 1922 occupies the tapering opening R12, and the bottom plug 1924 occupies the bottom recess R14. Therefore, the tapering plug 1922 tapers from the cap portion 194 to the bottom plug 1924. In other words, the tapering plug 1922 has a width greater than that of the bottom plug 1924, and the width of the tapering plug 1922 is spatially various. Similarly, the plug portion 202 may include a tapering plug 2022 and a bottom plug 2024 connected to each other. The tapering plug 2022 is present between the cap portion 204 and the bottom plug 2024. The tapering plug 2022 occupies the tapering opening R22, and the bottom plug 2024 occupies the bottom recess R24. Therefore, the tapering plug 2022 tapers from the cap portion 204 to the bottom plug 2024. In other words, the tapering plug 2022 has a width greater than that of the bottom plug 2024, and the width of the tapering plug 2022 is spatially various.

In some embodiments, the tapering plug 1922 and the sidewall 1422 of the gate spacer 142 define an angle $\alpha1$ that ranges from about 0 degrees to about 90 degrees. In some embodiments, the angle $\alpha1$ defined by the tapering plug 1922 and the sidewall 1422 of the gate spacer 142 may range from about 25 degrees to about 88 degrees, or from about 43 degrees to about 82 degrees, or about 67 degrees to about 79 degrees. Similarly, the tapering plug 2022 and the sidewall 1442 of the gate spacer 144 define an angle $\alpha2$ that ranges from about 0 degrees to about 90 degrees. In some embodiments, the angle $\alpha2$ defined by the tapering plug 2022 and the sidewall 1442 of the gate spacer 144 may range from about 25 degrees to about 88 degrees, or from about 43 degrees to about 82 degrees, or about 67 degrees to about 79 degrees. In some embodiments, the tapering plug 1922 and a sidewall of the bottom recess R14 define an angle $\beta1$ that ranges from about 90 degrees to 180 degrees. In some embodiments, the angle $\beta1$ defined by the tapering plug 1922 and the sidewall of the bottom recess R14 may range from about 102 degrees to about 163 degrees, or from about 115 degrees to about 154 degrees, or from about 120 degrees to about 146 degrees. Similarly, the tapering plug 2022 and a sidewall of the bottom recess R24 define an angle $\beta2$ that ranges from about 90 degrees to 180 degrees. In some embodiments, the angle $\beta2$ defined by the tapering plug 2022 and the sidewall of the bottom recess R24 may range from about 102 degrees to about 163 degrees, or from about 115 degrees to about 154 degrees, or from about 120 degrees to about 146 degrees.

In some embodiments, an exemplary method of forming the filling conductors 190 and 200 may include a deposition process such as CVD, PVD, ALD or other suitable process. After the deposition process, a CMP process may be applied to remove the excess filling conductors 190 and 200 that overfill outside the openings 162 and 164. In some embodiments, the filling conductors 190 and 200 are made by the same process and are made of substantially the same material. For example, the filling conductors 190 and 200 may include tungsten (W), aluminum (Al), copper (Cu) or other suitable conductive material.

Figure 15:
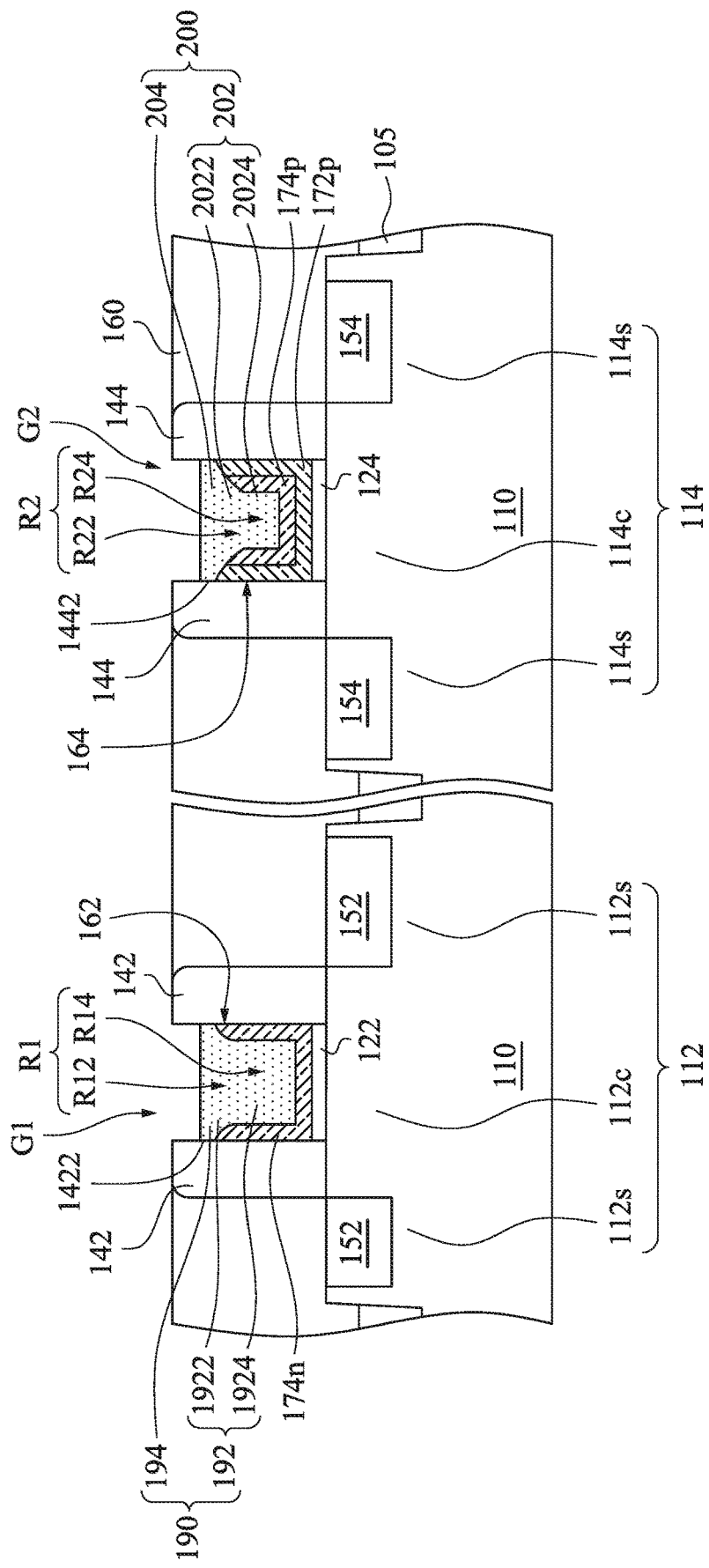

Reference is made to FIG. 15. A portion of the filling conductor 190 in the space between the exposed portions of the sidewalls 1422 of the gate spacers 142 is recessed, and a portion of the filling conductor 200 in the space between the exposed portions of the sidewalls 1442 of the gate spacers 144 is recessed as well. More particularly, upper portions of the cap portions 194 and 204 are removed, and lower portions of the cap portions 194 and 204 respectively remain in the N-type and P-type gate stacks G1 and G2. An exemplary method of recessing portions of the filling conductors 190 and 200 may include an etching process. For example, the recessing includes reacting an etchant with the filling conductors 190 and 200, in which the etchant has high selectivity between the filling conductors 190, 200 and the gate spacers 142, 144.

Figure 16:
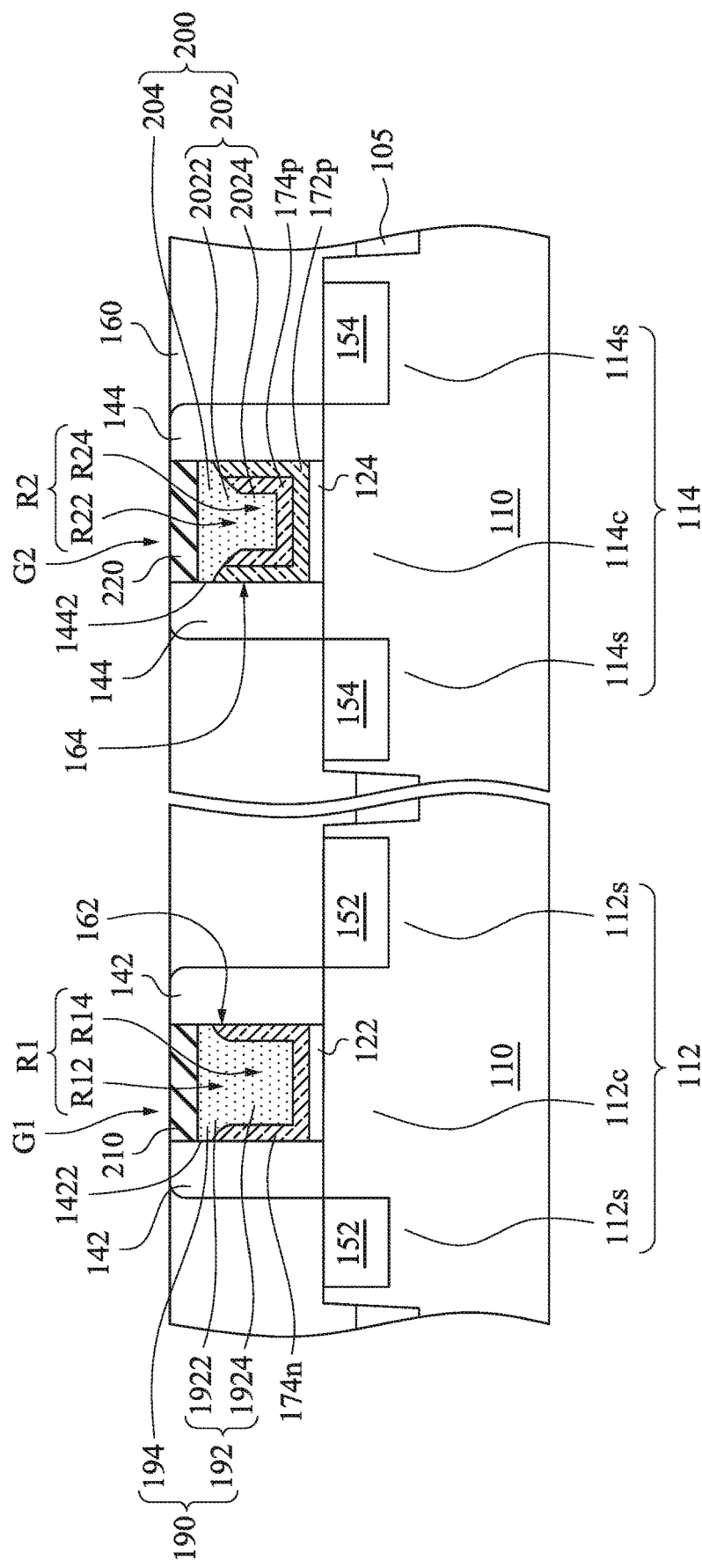

Reference is made to FIG. 16. Dielectric caps 210 and 220 are respectively formed on the recessed filling conductors 190 and 200. In other words, the dielectric caps 210 and 220 respectively cap the recessed filling conductors 190 and 200. The dielectric cap 210 and the work function conductor of the N-type gate stack G1, which includes the N-type work function conductor layer 174n, are spatially separated by the filling conductor 190. In particular, the cap portion 194 of the filling conductor 190 spatially separates the N-type work function conductor layer 174n from the dielectric cap 210. Similarly, the dielectric cap 220 and the work function conductor of the P-type gate stack G2, which includes the N-type and P-type work function conductor layers 174p and 172p, are spatially separated by the filling conductor 200. In particular, the cap portion 204 spatially separates the N-type and P-type work function conductor layers 174p and 172p from the dielectric cap 220. In some embodiments, the width of the cap portion 194 is not less than that of the dielectric cap 210, so as to benefit the cap portion 194 to spatially separate the overlying dielectric cap 210 from the underlying N-type work function conductor layer 174n. Similarly, the width of the cap portion 204 is not less than that of the dielectric cap 220, so as to benefit the cap portion 204 to spatially separate the overlying dielectric cap 220 from the underlying N-type and P-type work function conductor layers 174p and 172p.

An exemplary method of forming the dielectric caps 210 and 220 may include a deposition process, such as ALD, CVD, PVD or other suitable process. After the deposition process, a CMP process may be applied to remove the excess dielectric caps 210 and 220 that overfill outside the openings 162 and 164. The dielectric caps 210 and 220 may include silicon oxide, silicon nitride, silicon oxynitride, silicon carbide, low-dielectric constant dielectric material or other suitable material.

In some embodiments, since the filling conductor includes the cap portion that caps the work function conductor, the cap portion may increase the contact area of the gate stack. Moreover, in some embodiments, since the cap portions (or head portions) of the filling conductors of the N-type and P-type gate stacks have substantially the same width, the cap portions may provide optimized forces to push against the underlying work function conductors of the N-type and P-type gate stacks.

In some embodiments, a semiconductor device includes a semiconductor substrate and at least one gate stack. The gate stack is present on the semiconductor substrate, and the gate stack includes at least one work function conductor and a filling conductor. The work function conductor has a recess therein. The filling conductor includes a plug portion and a cap portion. The plug portion is present in the recess of the work function conductor. The cap portion caps the work function conductor.

In some embodiments, a semiconductor device includes a semiconductor substrate, at least one N-type gate stack and at least one P-type gate stack. The N-type gate stack is present on the semiconductor substrate. The N-type gate stack includes a filling conductor therein. The filling conductor has a head portion and a tail portion. The tail portion is present between the head portion and the semiconductor substrate. The P-type gate stack is present on the semiconductor substrate. The P-type gate stack includes a filling conductor therein. The filling conductor has a head portion and a tail portion. The tail portion is present between the head portion and the semiconductor substrate. The head portions of the filling conductors of the N-type gate stack and the P-type gate stack have substantially the same width.

In some embodiments, a method of manufacturing a semiconductor device includes forming at least two gate spacers on a semiconductor substrate, forming at least one work function conductor between the gate spacers, the work function conductor having a recess therein, recessing the work function conductor between the gate spacers to expose at least portions of sidewalls of the gate spacers, and forming a filling conductor in the recess and a space between the exposed portions of the sidewalls of the gate spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first gate stack comprising:
        a first work function conductor; and
        a first filling conductor comprising a plug portion and a cap portion; and
    a first gate spacer disposed on a first side of the first gate stack, wherein:
        the cap portion overlies an uppermost surface of the first work function conductor, and
        a sidewall of the plug portion is spaced apart from a sidewall of the first gate spacer by the first work function conductor.

2. The semiconductor device of claim 1, wherein a sidewall of the cap portion and a sidewall of the first work function conductor are in direct contact with the sidewall of the first gate spacer.

3. The semiconductor device of claim 1, wherein the plug portion is between a first portion of the first work function conductor and a second portion of the first work function conductor.

4. The semiconductor device of claim 1, comprising:
    a second work function conductor overlying the first work function conductor.

5. The semiconductor device of claim 1, comprising a dielectric cap overlying the cap portion.

6. The semiconductor device of claim 1, comprising a semiconductor fin disposed below the first gate stack.

7. The semiconductor device of claim 4, wherein the sidewall of the plug portion is spaced apart from the sidewall of the first gate spacer by the second work function conductor.

8. The semiconductor device of claim 4, wherein the first work function conductor is one of an n-type work function conductor or a p-type work function conductor and the second work function conductor is the other of the n-type work function conductor or the p-type work function conductor.

9. The semiconductor device of claim 5, wherein the dielectric cap is in direct contact with the sidewall of the first gate spacer.

10. The semiconductor device of claim 5, wherein cap portion is between the first work function conductor and the dielectric cap.

11. A semiconductor device, comprising:
    a first gate spacer and a second gate spacer; and
    a gate stack disposed between the first gate spacer and the second gate spacer, the gate stack comprising:

a gate dielectric;

a first work function conductor over the gate dielectric;

a filling conductor over the first work function conductor; and a dielectric cap, wherein a cap portion of the filling conductor is between an uppermost surface of the first work function conductor and the dielectric cap.

12. The semiconductor device of claim 11, wherein the filling conductor comprises a plug portion and the cap portion, wherein the plug portion is spaced apart from first gate spacer by the first work function conductor.

13. The semiconductor device of claim 11, wherein the gate dielectric is in direct contact with the first gate spacer and the second gate spacer.

14. The semiconductor device of claim 11, comprising:

a second work function conductor between the first work function conductor and the filling conductor.

15. The semiconductor device of claim 12, wherein the cap portion is in direct contact with the first gate spacer.

16. A method of manufacturing a semiconductor device, the method comprising:

forming a first work function conductor between a first gate spacer and a second gate spacer, wherein the first work function conductor defines a first recess;

recessing the first work function conductor to define a second recess having a second width greater than a first width of the first recess;

forming a filling conductor in the first recess and the second recess; and recessing the filling conductor to define a third recess.

17. The method of claim 16, comprising forming a dielectric layer in the third recess.

18. The method of claim 16, the recessing the filling conductor comprising recessing the filling conductor while maintaining a portion of the filling conductor above an uppermost surface of the first work function conductor.

19. The method of claim 16, comprising forming a second work function conductor over the first work function conductor prior to the recessing the first work function conductor.

20. The method of claim 16, wherein the third recess has the second width.

* * * * *